US009301426B2

(12) United States Patent
Wennberg et al.

(10) Patent No.: US 9,301,426 B2
(45) Date of Patent: Mar. 29, 2016

(54) MICROWAVE MODULE

(71) Applicant: Huawei Technologies Co., Ltd., Shenzhen (CN)

(72) Inventors: Goran Wennberg, Billdal (SE); Peter Hammar, Molndal (SE); Bengt Madeberg, Stockholm (SE); Leif Bergstedt, Varberg (SE)

(73) Assignee: Huawei Technologies Co., Ltd., Shenzhen (CN)

( * ) Notice: Subject to any disclaimer, the term of this patent is extended or adjusted under 35 U.S.C. 154(b) by 469 days.

(21) Appl. No.: 13/860,764

(22) Filed: Apr. 11, 2013

(65) Prior Publication Data

US 2013/0215576 A1    Aug. 22, 2013

Related U.S. Application Data

(63) Continuation of application No. PCT/CN2011/074171, filed on May 17, 2011.

(51) Int. Cl.
*H05K 9/00* (2006.01)
*H05K 7/20* (2006.01)

(52) U.S. Cl.
CPC ............ *H05K 7/2039* (2013.01); *H05K 9/0056* (2013.01)

(58) Field of Classification Search
USPC ........... 361/816, 818, 752–753; 343/700 MS, 343/702, 743
See application file for complete search history.

(56) References Cited

U.S. PATENT DOCUMENTS 4,792,939 A * 12/1988 Hikita ...................... H04B 1/50
370/277

5,206,796 A * 4/1993 Thompson ............. H05K 9/002
174/359
5,690,614 A * 11/1997 Carr ....................... A61B 18/18
219/687
5,740,013 A * 4/1998 Roesner ................ H01L 23/467
174/383
2002/0113674 A1 * 8/2002 Kondo .................... H01P 5/107
333/248
2005/0105478 A1    5/2005 Hwang et al.
2007/0296518 A1   12/2007 Avramis et al.
2010/0182206 A1 * 7/2010 Barbieri ............... H01Q 1/2291
343/702
2011/0122028 A1    5/2011 Saario et al.

FOREIGN PATENT DOCUMENTS

CN    1838476 A    9/2006
CN    1881676 A    12/2006

(Continued)

OTHER PUBLICATIONS

Foreign Communication From a Counterpart Application, European Application No. 11865615.6, Extended European Search Report dated Aug. 28, 2015, 6 pages.
Foreign Communication From a Counterpart Application, Chinese Application No. 2011800039627, Chinese Search Report dated Nov. 7, 2013, 2 pages.

(Continued)

*Primary Examiner* — Tuan T Dinh
(74) *Attorney, Agent, or Firm* — Conley Rose, P.C.; Grant Rodolph; Nicholas K. Beaulieu (57) ABSTRACT

The present application relates to a microwave module comprising a printed circuit board, a first housing part, a second housing part, and a diplexer. It is specifically proposed that the first and second housing parts are adapted to act as a shielding cover, and that the diplexer and its filter are an integrated part in the module and are made out of the shielding cover and the printed circuit board.

21 Claims, 6 Drawing Sheets

(56) References Cited

FOREIGN PATENT DOCUMENTS

| | | |
|---|---|---|
| CN | 101080851 A | 11/2007 |
| CN | 201063632 Y | 5/2008 |
| CN | 201146505 Y | 11/2008 |
| CN | 101355189 A | 1/2009 |
| CN | 201345403 Y | 11/2009 |
| EP | 2221910 A1 | 8/2010 |
| EP | 2390953 A1 | 11/2011 |
| JP | 2001136008 A | 5/2001 |
| JP | 2004253966 A | 9/2004 |

OTHER PUBLICATIONS

Foreign Communication From a Counterpart Application, Chinese Application No. 201180003962.7, Chinese Office Action dated Nov. 15, 2013, 4 pages.

Foreign Communication From a Counterpart Application, PCT Application PCT/CN2011/074171, International Search Report dated Feb. 23, 2012, 3 pages.

Foreign Communication From a Counterpart Application, PCT Application PCT/CN2011/074171, Written Opinion dated on Feb. 23, 2012, 5 pages.

\* cited by examiner

MICROWAVE MODULE

CROSS-REFERENCE TO RELATED APPLICATION

This application is a continuation of International Application No. PCT/CN2011/074171, filed on May 17, 2011, which is hereby incorporated by reference in its entirety.

STATEMENT REGARDING FEDERALLY SPONSORED RESEARCH OR DEVELOPMENT

Not applicable.

REFERENCE TO A MICROFICHE APPENDIX

Not applicable.

TECHNICAL FIELD

The present application relates to a microwave module comprising a printed circuit board (PCB), a first housing part, a second housing part, and a diplexer.

BACKGROUND

In the making of commercial microwave link components there is a constant struggle with cost and quality issues in order to fulfill customer demand and cope with market competition.

Usually a diplexer is a purchased pre-tuned part with a fixed sub-band. This means that different diplexers are required depending on what sub-band the user wants.

A common design approach of a microwave link outdoor unit is to stack the PCB, the shielding cover, the diplexer, and the waveguide nose. Since all parts have mechanical tolerances, it is a problem to solve the sum of the mismatch of these different components in order to get a weather proof unit.

This solution of assembly design will only let the PCB come in close contact with one side of the cabinet. The thermal distance to the other side is much longer due to shielding cover diplexer and waveguide nose. This leads to a problem with heat sink performance and hence increased internal temperature in the outdoor unit.

SUMMARY

The present application relates to a microwave module comprising a PCB, a first housing part, a second housing part, and a diplexer. It is specifically proposed that the first and second housing parts are adapted to act as a shielding cover, that the diplexer and its filter are an integrated part in the module and are made out of the shielding cover and the PCB.

The application teaches that the PCB is positioned between the first and second housing part, that the PCB has a microwave side with a large plated area facing the second housing part, that the second housing part has a filter geometry facing the PCB, and that the diplexer is made out of the filter geometry and the plated area, which plated area is adapted to function as a metal cover towards the filter geometry of the second housing part.

It is also proposed that the first housing part functions as the mechanical fix point adapted to be fastened to an antenna and it comprises a wave guide adapted to lead a microwave signal in and out of the module. It also has two backshort cavities.

The outside of the first housing part has cooling flanges in a 45° direction, and the module is adapted to be fastened to the antenna so that the cooling flanges are protected from the sun by the antenna when the module is fastened to the antenna.

In order to allow the signal to be transferred between the diplexer and the antenna, it is proposed that the PCB has a plated wave guide hole adapted to feed the signal in and out from the antenna.

It is also proposed that the plated area will have at least two wave guide holes. The PCB comprises a Teflon layer, FR4 layers and the plated area, and the wave guide hole is made in the FR4 layers but not in the Teflon layer, the Teflon layer has an antenna probe in the middle of the wave guide hole.

In order to ensure electrical leakage to the wave guide holes of the plated area, it is proposed that via-holes are positioned all around the wave guide holes.

With the purpose of providing a tunable diplexer, the present application teaches that the side facing away from the PCB of the second housing part has threaded holes for tuning screws into the filter.

It is also proposed that the side facing away from the PCB of the second housing part has an area for connectors, where connectors are mounted on this area for connectors, where pins from these connectors are guided through the second housing part to the PCB, and where the PCB has receptors adapted to a mechanical and electrical contact with these pins. It is proposed that the area for connectors is mechanically protected.

The present application teaches that a loopback function is integrated on the PCB.

The diplexer function can be designed according to either magnetizing field plane (H-plane) or electric field plane (E-plane) technologies.

It is proposed that isolators are integrated on the PCB, and that the isolators are adapted to be housed by the first housing part.

The small amount of components makes it easier to ensure that the module is weather protected. It is proposed that at least one O-ring is positioned between the first and second housing parts in order to provide this protection.

It is proposed that the second housing part has a slot around its edge, and that a first O-ring is positioned in this slot adapted to function as a sheared gasket solution when the second housing part is mounted to the first housing part.

It is also proposed that a sealed protection plate is adapted to cover the part of the side facing away from the PCB of the second housing part that has threaded holes for tuning screws into the filter and any holes for mounting screws for fixating the first and second housing part to each other.

This protection plate can also be sealed to the second housing part by an O-ring or any other sealing gasket solution.

The advantages of a microwave module according to the present application are that the diplexer and isolators are integrated into the shielding cover and the PCB and will not be physically separate parts. This solution will provide a compact design, a better thermal solution, and there will be no tolerance chain in the assembly enabling a weather proof module. The present application has focus on a few numbers of parts in the assembly structure and that will result in low cost, easy manufacturing, and a smooth design. The key to this result is to integrate the diplexer into the PCB and the shielding cover.

BRIEF DESCRIPTION OF THE DRAWINGS

A microwave module according to the present application will now be described in detail with reference to the accompanying drawings, in which.

DETAILED DESCRIPTION

Figure 1:
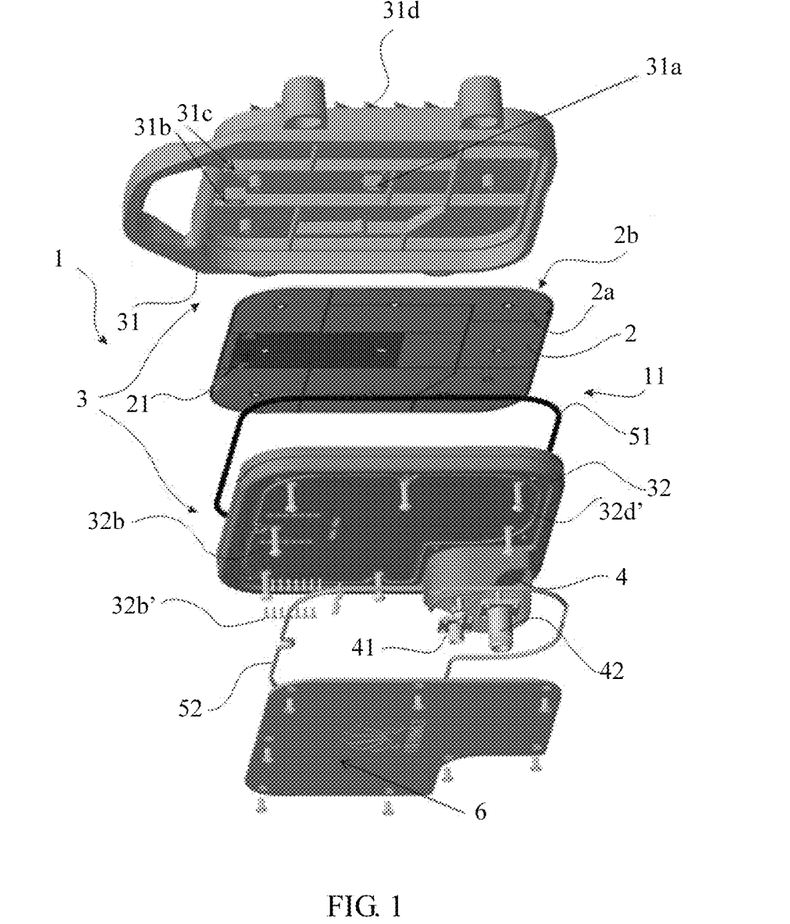
FIG. 1 is a first schematic and exploded view of an inventive microwave module.

The present application will now be described with reference to FIG. 1 showing a microwave module 1 in an exploded view. The module 1 comprises a PCB 2, a first housing part 31, a second housing part 32, and a diplexer 11.

The first and second housing parts 31, 32 are adapted to act as a shielding cover 3, and the diplexer 11 and its filter are an integrated part in the module 1 and are made out of the shielding cover 3 and the PCB 2.

Figure 2:
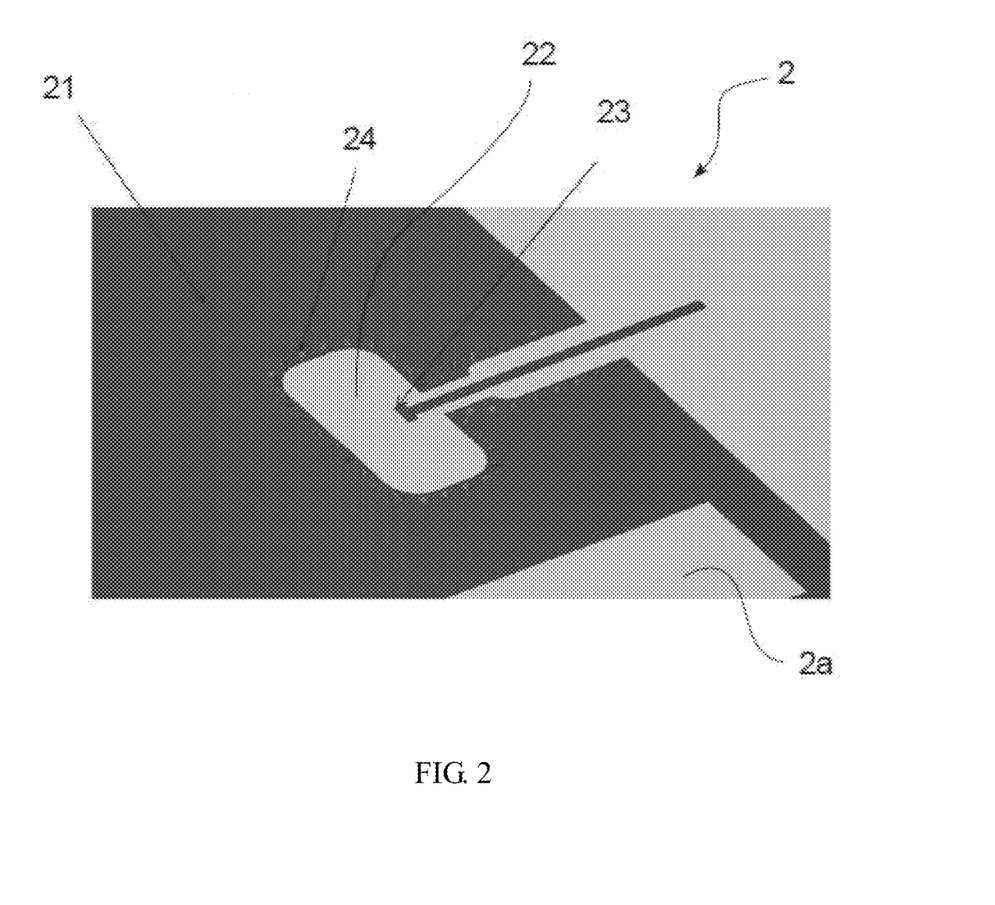
FIG. 2 is a detailed part of a printed circuit board according to the present application.
Figure 3:
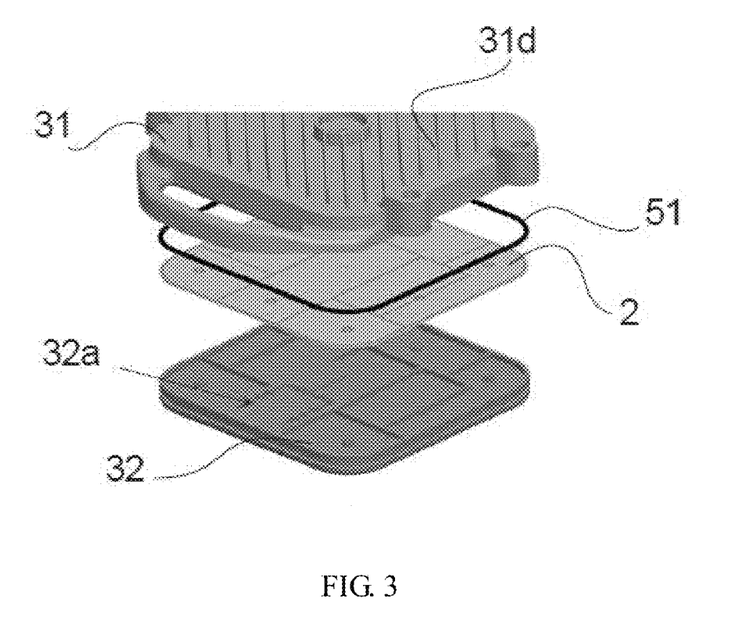
FIG. 3 is second schematic and exploded view of an inventive microwave module.

As can be seen in the figure, the PCB 2 is positioned between the first and second housing parts 31, 32. The PCB 2 has a microwave side 2a and a component side 2b. FIG. 2 shows the microwave side 2a with a large plated area 21 facing the second housing part 32. In FIG. 3 it is shown that the second housing part 32 has a filter geometry 32a facing the PCB 2. The diplexer 11 is made out of the filter geometry 32a and the plated area 21.

The plated area 21 is adapted to function as a metal cover towards the filter geometry 32a of the second housing part 32.

The first housing part 31 functions as the mechanical fix point adapted to be fastened to an antenna.

Since the first housing part 31 is the part facing the antenna, this housing part comprises a wave guide 31a adapted to lead a microwave signal in and out of the module 1, and it can also have backshort cavities, where two backshort cavities 31b, 31c are shown in the figure.

The outside of said first housing part 31 has cooling flanges 31d in a 45° direction. The module 1 is adapted to be fastened to an antenna so that the cooling flanges 31d are protected from the sun by the antenna when the module is fastened to the antenna.

FIG. 2 shows that the PCB 2 has a plated wave guide hole 22 adapted to feed the signal in and out from the antenna. It is proposed that the plated area 21 will have at least two wave guide holes, one being shown in FIG. 2. The PCB 2 comprises a Teflon layer, FR4 layers and the plated area 21, and it is proposed that the wave guide hole 22 is made in the FR4 layers but not in the Teflon layer. It is also proposed that the Teflon layer has an antenna probe 23 in the middle of the wave guide hole 22. It is also proposed that via-holes 24 are positioned all around the wave guide holes 22.

FIG. 1 shows that the side facing away from the PCB 2 of the second housing part 32 has threaded holes 32b for tuning screws 32b' into the filter 32a, whereby it is possible to tune the diplexer into different sub frequencies.

Figure 4:
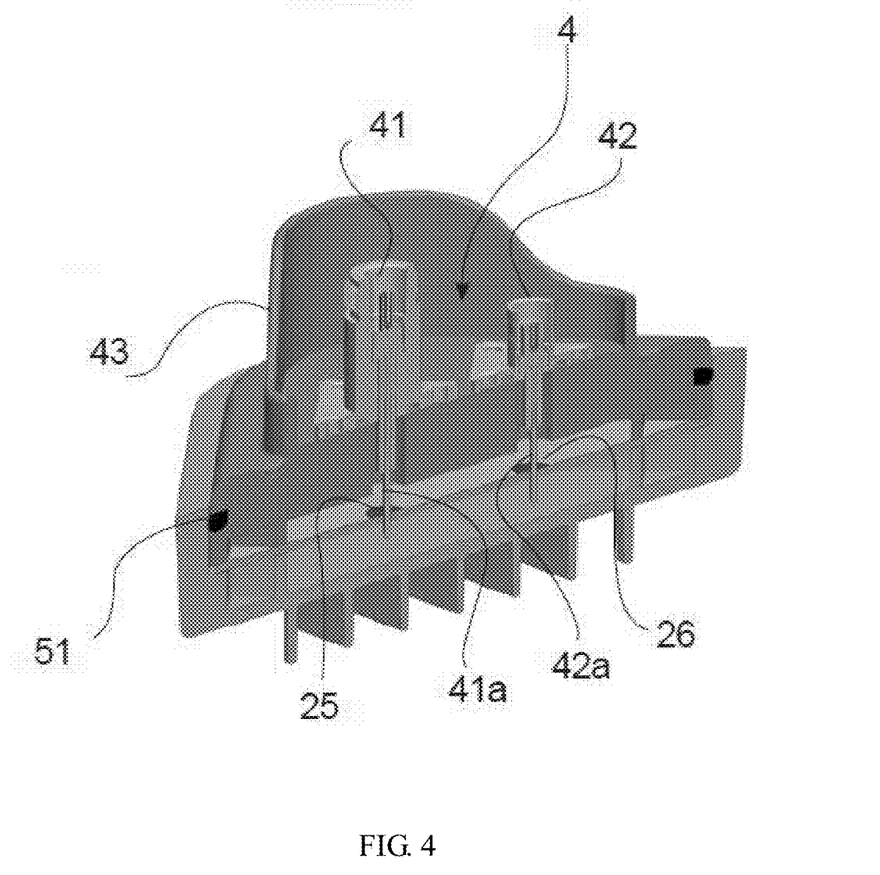
FIG. 4 is a cross-sectional view of an area for connectors.

It is also shown that the side facing away from said PCB 2 of the second housing part 32 has an area 4 for connectors 41, 42, also shown in FIG. 4.

Connectors 41, 42 are mounted on the area for connectors 4, and pins 41a, 42a from the connectors 41, 42 are guided through the second housing part 32 to the PCB 2. FIG. 4 also shows that the PCB 2 has receptors 25, 26 adapted to a mechanical and electrical contact with these pins 41a, 42a. It is also proposed that the area for connectors 4 is mechanically protected, in the figure by a protecting frame 43.

Figure 5:
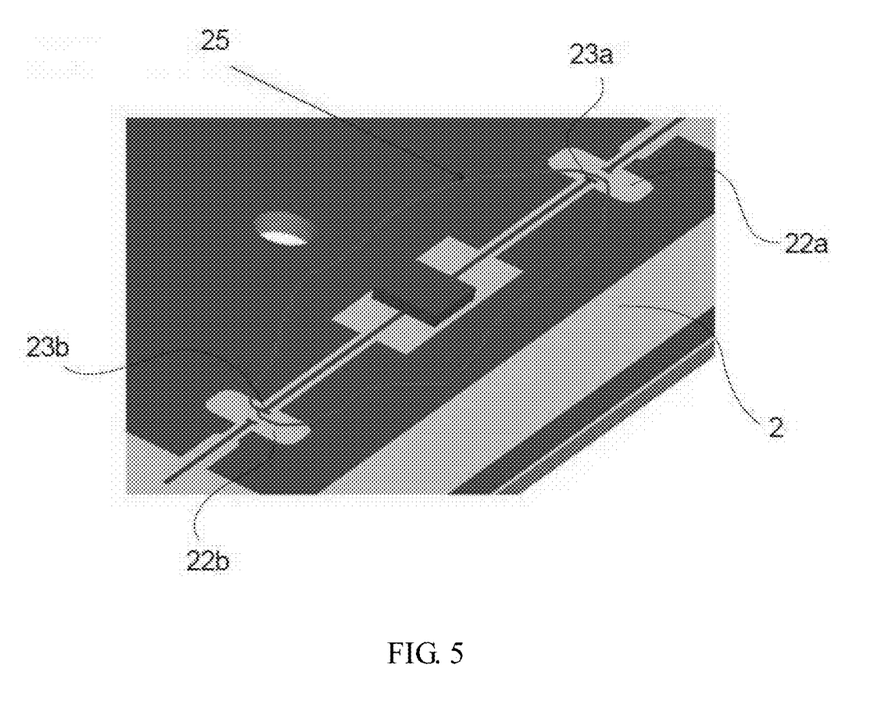
FIG. 5 is an enlarged view of a loopback function.

FIG. 5 shows a part of a PCB 2 where two wave guide holes 22a, 22b and their respective antenna probes 23a, 23b form a loopback function 25 integrated on the PCB 2.

It should be understood that the present application can be implemented for a diplexer function designed according to both H-plane and E-plane technologies.

According to one proposed embodiment, used isolators are integrated on the PCB and are mounted on the PCB together with other components belonging to the PCB. It is also proposed that the isolators are integrated on the PCB so that they are housed by the first housing part.

One purpose of the present application is to provide an easier way of making the module weather protected. The small number of components will make this possible.

Figure 6:
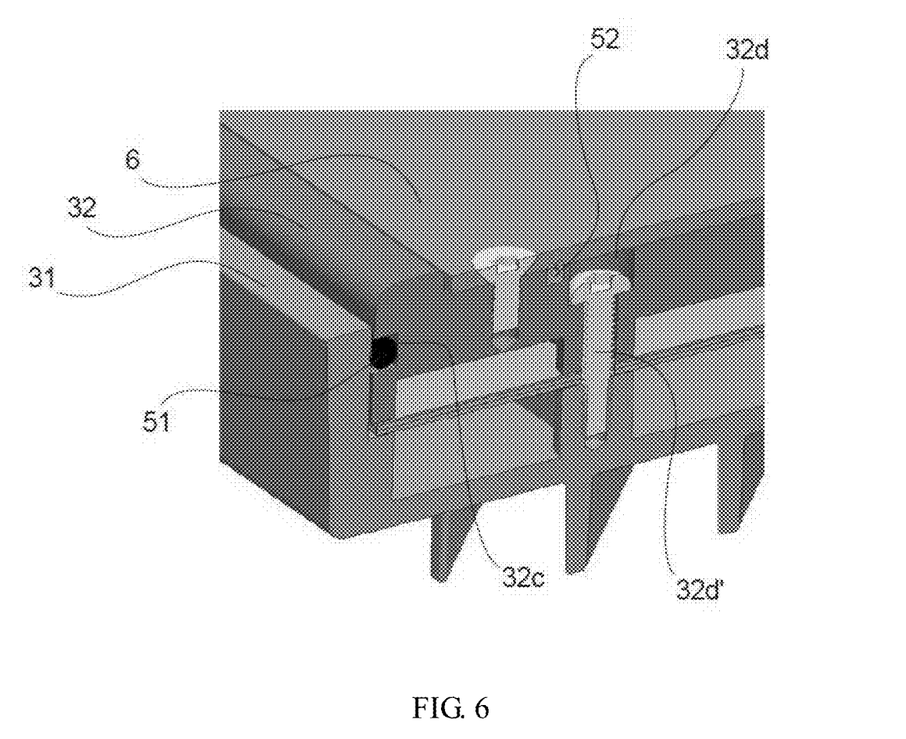
FIG. 6 is a cross-sectional view of the weather sealing of an inventive microwave module.

FIG. 6 shows that at least one O-ring is positioned between the first and second housing parts 31, 32. It is also proposed that the second housing part 32 has a slot 32c around its edge, and that a first O-ring 51 is positioned in the slot 32c adapted to function as a sheared gasket solution.

It is also proposed that a sealed protection plate 6 is adapted to cover the part of the side facing away from said PCB of said second housing part 32 that has threaded holes 32b for tuning screws 32b' into the filter 32a and any holes 32d for mounting screws 32d' for fixating the first and second housing parts 31, 32 to each other. The protection plate 6 is sealed to the second housing part 32 by a second O-ring 52 or any other sealing gasket solution.

It will be understood that the invention is not restricted to the afore described and illustrated exemplifying embodiments thereof and that modifications can be made within the scope of the invention as defined by the accompanying claims.

What is claimed is:

1. A microwave module comprising:
    a first housing part;
    a second housing part coupled to the first housing part and comprising a filter geometry; and
    a printed circuit board (PCB), positioned between the first housing part and the second housing part and comprising an integrated loopback function,
    wherein the first housing part and the second housing part comprise a shielding cover configured to shield the PCB,
    wherein the filter geometry and the PCB comprise a diplexer,
    wherein the PCB comprises a microwave side with a large plated area facing the second housing part,
    wherein the filter geometry faces the PCB,
    wherein the filter geometry and the plated area comprise the diplexer, and
    wherein the plated area is configured to function as a metal cover towards the filter geometry of the second housing part.

2. The microwave module according to claim 1, wherein the first housing part functions as a mechanical fix point configured to be fastened to an antenna.

3. The microwave module according to claim 1, wherein a side facing away from the PCB of the second housing part has threaded holes for tuning screws into the filter geometry.

4. The microwave module according to claim 1, wherein the diplexer function is designed according to H-plane technologies.

5. The microwave module according to claim 1, wherein the diplexer function is designed according to E-plane technologies.

6. The microwave module according to claim 1, wherein isolators are integrated on the PCB such that the isolators are housed by the first housing part.

7. The microwave module according to claim 1, wherein the module is weather protected.

8. The microwave module according to claim 1, wherein a sealed protection plate is configured to cover the part of the side facing away from the PCB of the second housing part, and wherein the sealed protection plate comprises threaded holes for tuning screws into the filter geometry and holes for mounting screws for fixating the first housing part and the second housing part to each other.

9. The microwave module according to claim 2, wherein the first housing part comprises a wave guide configured to lead a microwave signal in and out of the module.

10. The microwave module according to claim 2, wherein the first housing part comprises two backshort cavities.

11. The microwave module according to claim 2, wherein an outside of the first housing part comprises cooling flanges in a 45° direction, and wherein the module is configured to be fastened to the antenna such that the cooling flanges are protected from the sun by the antenna when the module is fastened to the antenna.

12. The microwave module according to claim 3, wherein the side facing away from the PCB of the second housing part comprises an area for connectors, wherein the connectors are mounted on the area for the connectors, wherein pins from the connectors are guided through the second housing part to the PCB, and wherein the PCB has receptors adapted to a mechanical contact and an electrical contact with the pins.

13. The microwave module according to claim 7, wherein at least one O-ring is positioned between the first housing part and the second housing part.

14. The microwave module according to claim 8, wherein the sealed protection plate is sealed to the second housing part by an O-ring or another sealing gasket solution.

15. The microwave module according to claim 9, wherein the PCB has a plated wave guide hole configured to feed the signal in and out from the antenna.

16. The microwave module according to claim 12, wherein the area for the connectors is mechanically protected.

17. The microwave module according to claim 13, wherein the second housing part comprises a slot around an edge of the side facing the PCB, and wherein a first O-ring is positioned in the slot and configured to function as a sheared gasket solution.

18. The microwave module according to claim 15, wherein the plated area comprises at least two wave guide holes.

19. The microwave module according to claim 15, wherein via-holes are positioned around the wave guide holes.

20. The microwave module according to claim 18, wherein the PCB comprises a Teflon layer, FR4 layers, and the plated area, and wherein the wave guide hole is made in the FR4 layers and not in the Teflon layer.

21. The microwave module according to claim 20, wherein the Teflon layer comprises an antenna probe in a middle of the wave guide hole.

* * * * *